United States Patent
Li

(10) Patent No.: US 8,873,323 B2
(45) Date of Patent: Oct. 28, 2014

(54) METHOD OF EXECUTING WEAR LEVELING IN A FLASH MEMORY DEVICE ACCORDING TO AMBIENT TEMPERATURE INFORMATION AND RELATED FLASH MEMORY DEVICE

(75) Inventor: Tseng-Ho Li, Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 329 days.

(21) Appl. No.: 13/586,867

(22) Filed: Aug. 16, 2012

(65) Prior Publication Data

US 2014/0050026 A1   Feb. 20, 2014

(51) Int. Cl.
*G11C 7/04*   (2006.01)

(52) U.S. Cl.
USPC ............... 365/211; 365/185.11; 365/189.07; 365/185.21

(58) Field of Classification Search
CPC ... G11C 11/5642; G11C 11/5628; G11C 7/04
USPC ............ 365/211, 185.11, 189.07, 185.21
See application file for complete search history.

(56) References Cited

U.S. PATENT DOCUMENTS

| | | | |
|---|---|---|---|
| 8,111,559 B2 | 2/2012 | Kwon | |
| 8,213,255 B2 | 7/2012 | Hemink | |
| 2009/0310408 A1* | 12/2009 | Lee et al. | 365/185.03 |
| 2010/0259998 A1* | 10/2010 | Kwon et al. | 365/189.05 |
| 2011/0185224 A1 | 7/2011 | Tsai | |
| 2011/0299338 A1* | 12/2011 | Lee et al. | 365/185.18 |
| 2012/0224425 A1* | 9/2012 | Fai et al. | 365/185.09 |
| 2014/0126292 A1* | 5/2014 | Yang et al. | 365/185.18 |

* cited by examiner

*Primary Examiner* — Tuan T Nguyen
(74) *Attorney, Agent, or Firm* — Winston Hsu; Scott Margo

(57) ABSTRACT

A method of executing wear leveling in a flash memory device includes determining whether a current temperature is in a normal operating temperature range of the flash memory device, and reprogramming data associated with data blocks to another location in a flash memory array when the current temperature is in the normal operating temperature range of the flash memory device, wherein the data is programmed in a temperature out of the normal operating temperature range of the flash memory device.

20 Claims, 3 Drawing Sheets

1

METHOD OF EXECUTING WEAR LEVELING IN A FLASH MEMORY DEVICE ACCORDING TO AMBIENT TEMPERATURE INFORMATION AND RELATED FLASH MEMORY DEVICE

BACKGROUND

1. Technical Field

The invention relates to flash memory devices, and more particularly, to a method of executing wear leveling while taking into consideration ambient temperature information of the flash memory devices.

2. Description of the Conventional Art

Flash memory has become an increasingly popular type of memory in recent years, and flash memory is now used in a variety of consumer electronic devices. Flash memory device manufacturers typically specify a range of operating temperatures under which the flash memory devices should be operated for optimum results. However, the flash memory device manufacturers ultimately have no control over the temperature conditions in which the end user will use the flash memory devices.

It has been observed that the operation and behavior of flash memory devices can be affected by temperature. If data is programmed in a flash memory at one extreme temperature and then later read at an opposite extreme temperature, the read data may not match the programmed data due to electron displacement effects that are influenced by the temperature change.

Please refer to FIG. 1. FIG. 1 is a diagram showing examples of two worst case scenarios for producing data errors due to temperature differences between data programming and data reading actions performed on a prior art flash memory device. Scenario 1 contains steps 10, 12, and 14. In step 10 data is programmed to the flash memory device when the ambient temperature information of the flash memory device is −40° C. In step 12 data is read from the flash memory device when the ambient temperature information of the flash memory device is 25° C. In step 14 data is read from the flash memory device when the ambient temperature information of the flash memory device is 85° C. Thus, in scenario 1, the temperature in step 10 is considerably lower than the temperature in step 14. As a result, the data read in step 14 may not match the data programmed in step 10 due to electron displacement effects that are influenced by the large temperature change from step 10 to step 14.

Scenario 2 is a substantial opposite situation depicted in scenario 1. Scenario 2 contains steps 20, 22, and 24. In step 20 data is programmed to the flash memory device when the ambient temperature information of the flash memory device is 85° C. In step 22 data is read from the flash memory device when the ambient temperature information of the flash memory device is 25° C. In step 24 data is read from the flash memory device when the ambient temperature information of the flash memory device is −40° C. Thus, in scenario 2, the temperature in step 20 is much higher than the temperature in step 24. Consequently, the data read in step 24 may not match the data programmed in step 20 due to electron displacement effects that are influenced by the temperature change.

Another factor that may be affected by the temperature change is the occurrence of read disturb errors. Read disturb errors arise when non-selected memory blocks are unintentionally programmed while selected neighboring memory blocks are programmed. Extreme operating temperatures of flash memory devices outside of the optimum operating temperature ranges can exacerbate the effects of read disturb errors.

Due to the inability to predict under what operating temperatures the end user will operate a flash memory device, there exists the possibility of data loss due to wide temperature fluctuations. Since flash memory devices may be used in harsh environments, such as in industrial or automotive applications, there is a need for flash memory devices that can maintain data integrity despite these temperature fluctuations.

In conventional flash memory devices error correction code (ECC) engines are often used to correct errors that are detected in data. However, there exists no simple and effective mechanism for forecasting errors or even preventing the errors from occurring due to temperature fluctuations.

SUMMARY

It is therefore one of the primary objectives of the claimed invention to provide a method of executing wear leveling in a flash memory device according to ambient temperature information of the flash memory device.

According to an exemplary embodiment of the claimed invention, a method of executing wear leveling in a flash memory device according to temperature information recorded in the flash memory device is disclosed. The method includes determining whether a current temperature is in a normal operating temperature range of the flash memory device, and reprogramming data associated with data blocks to another location in a flash memory array when the current temperature is in the normal operating temperature range of the flash memory device, wherein the data is programmed in a temperature out of the normal operating temperature range of the flash memory device.

According to another exemplary embodiment of the claimed invention, a flash memory device includes a controller for controlling operation of the flash memory device, a temperature sensor for providing ambient temperature information of the flash memory device to the controller, and a flash memory array controlled by the controller to store data and record temperature information of the data, which is a temperature while the data is programmed to data blocks in the flash memory array. The temperature information of the data is updated by executing wear leveling in the flash memory device in a normal operating temperature range of the flash memory device when the data is programmed in the temperature which is out of the normal operating temperature range.

According to yet another exemplary embodiment of the claimed invention, a method of executing wear leveling in a flash memory device according to temperature information recorded in the flash memory device is disclosed. The method includes programming data to data blocks in a flash memory array in a first temperature which is out of a normal operating temperature range of the flash memory device, and recording the first temperature as first temperature information in the flash memory array. The method also includes determining whether a current temperature is in the normal operating temperature range of the flash memory device, and reprogramming the data associated with the data blocks to another location in the flash memory array when the current temperature is in the normal operating temperature range of the flash memory device.

It is an advantage that the present invention records ambient temperature information associated with data written do the flash memory device. In this way the flash memory device can have an indication of what the ambient temperature information of the flash memory device was when the data was last written to the flash memory device. Furthermore, when performing wear leveling on data recorded on the flash memory device in the condition that the current ambient temperature is within the normal operating temperature range but the recorded ambient temperature information indicates that the data was programmed to the flash memory device when the ambient temperature of the flash memory device was outside the normal operating temperature range, an updated ambient temperature information will be recorded in the flash memory when the data is reprogrammed as part of the wear leveling process. By updating the ambient temperature information data associated with the data reprogrammed through the wear leveling process, the flash memory will be aware of the ambient temperature information at which the data was most recently written to the flash memory device, which will increase the confidence in the accuracy of this stored data. Moreover, since updating the recorded temperature is part of the usual wear leveling process, no significant extra burden is put on the flash memory device for updating the recorded ambient temperature information data when the data is reprogrammed by the wear leveling process.

The temperature data is not limited to being recorded in the spare areas of the flash memory array. For example, the temperature data can be recorded in data blocks as a part of the stored data information, or a small area of the data block can be separated for recording the temperature data.

The temperature sensor can be integrated with the controller, or can be a separate component. Also, the flash memory device can be any storage apparatus containing flash memory inside, such as a solid-state drive or a memory card.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
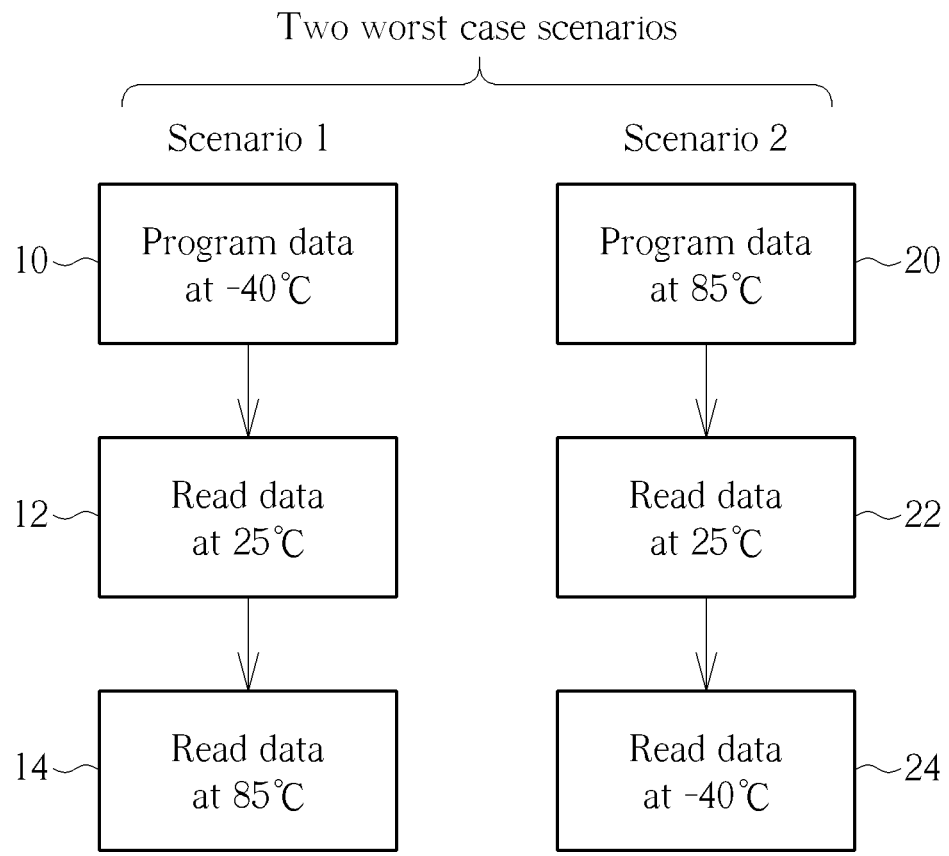
FIG. 1 is a diagram showing examples of two worst case scenarios for producing data errors due to temperature differences between data programming and data reading actions performed on a prior art flash memory device.
Figure 2:
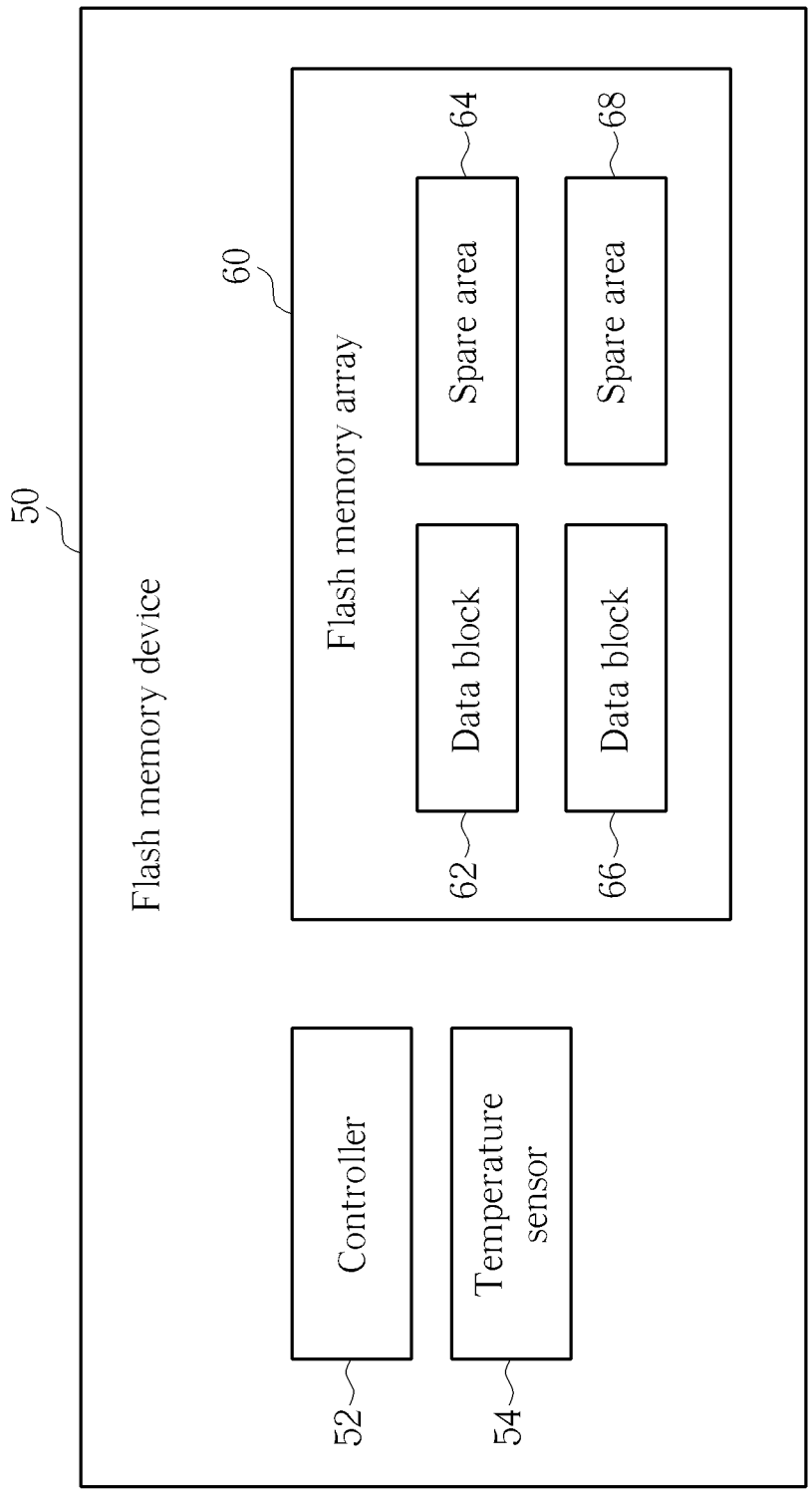
FIG. 2 is a functional block diagram of a flash memory device according to one embodiment of the present invention.

Please refer to FIG. 2. FIG. 2 is a functional block diagram of a flash memory device 50 according to one embodiment of the present invention. The so-called flash memory device in the present invention may include any storage apparatus containing flash memory inside, such as a solid-state drive or a memory card. The flash memory device 50 contains a controller 52 for controlling operation of the flash memory device 50 and a temperature sensor 54 for measuring an ambient temperature of the flash memory device 50. It should be noted that the temperature sensor 54 can be integrated with the controller 52 as a single component, or can be separately set up out of the flash memory device 50 to provide the ambient temperature information to the controller 52 of the flash memory device 50. A firmware may be embedded in the controller 52 to be executed by the controller 52 for operating the flash memory device 50.

The flash memory device 50 also includes a flash memory array 60 containing a plurality of data blocks 62 and 66 as well as a plurality of spare areas 64 and 68. The data blocks 62 and 66 store data that is programmed or written to the flash memory device 50. Notably, this embodiment of the present invention uses the spare areas 64 and 68 for recording the ambient temperature information of the flash memory device 50 as measured by the temperature sensor 54 at the time that data is programmed to the data blocks 62 and 66. The spare areas 64 and 68 therefore provide an indication of the integrity of the data stored in the data blocks 62 and 66 based on whether the recorded ambient temperature information is within the normal operating temperature range for the flash memory device 50. Please note that the number of spare areas used for storing the temperature data does not necessarily need to equal the number of data blocks, and multiple temperature data can be recorded in a single spare area if desired. Also, the temperature data is not limited to being recorded in the spare areas of the flash memory array 60 as mentioned in this embodiment of the present invention. For example, the temperature data is able to be recorded in the data blocks 62 and 66 as a part of the stored data information, or a small area of the data blocks 62 and 66 can be separated for storing the temperature data.

All flash memory devices have their own temperature range for normal operating, which may depend on the manufacturing process, types of memory chip, etc. In this embodiment of the present invention, suppose that the normal operating temperature range for the flash memory device 50 is between −25° C. and 70° C. While in ideal situations the flash memory device 50 would only be operated within this normal operating temperature range, this operating temperature range may not always be true in practical applications. There may be short time periods in which the ambient temperature of the flash memory device 50 is, for example, between −40° C. and −25° C. or between 70° C. to 85° C. At other times the ambient temperature may be room temperature. However, this ambient temperature information could later fluctuate to being less than −25° C. or being greater than 70° C. Because it is difficult to ensure what the ambient temperature of the flash memory device 50 will be when used by the end user, the present invention records the ambient temperature information of the data that is programmed to the flash memory device 50 to provide an indication of this temperature information.

As previously mentioned in the preferred embodiment of the present invention, the ambient temperature information will be recorded in the memory array 60 of the flash memory device 50 when the data is programmed to the data blocks 62 and 66 in the memory array 60. However, in another embodiment of the present invention, the ambient temperature information will be recorded in the memory array 60 only in the situation that the data is programmed to the data blocks in the temperature which is out of the normal operating temperature range for the flash memory device 50, otherwise the ambient temperature information will not be recorded. Once the data, which is programmed in the temperature out of the normal operating temperature range for the flash memory device 50, is reprogrammed by executing wear leveling under the normal operating temperature range of the of the flash memory device 50 as mentioned above, the recorded ambient temperature information will be erased. This can be looked on as another format of updating the recorded ambient temperature information of the data.

Figure 3:
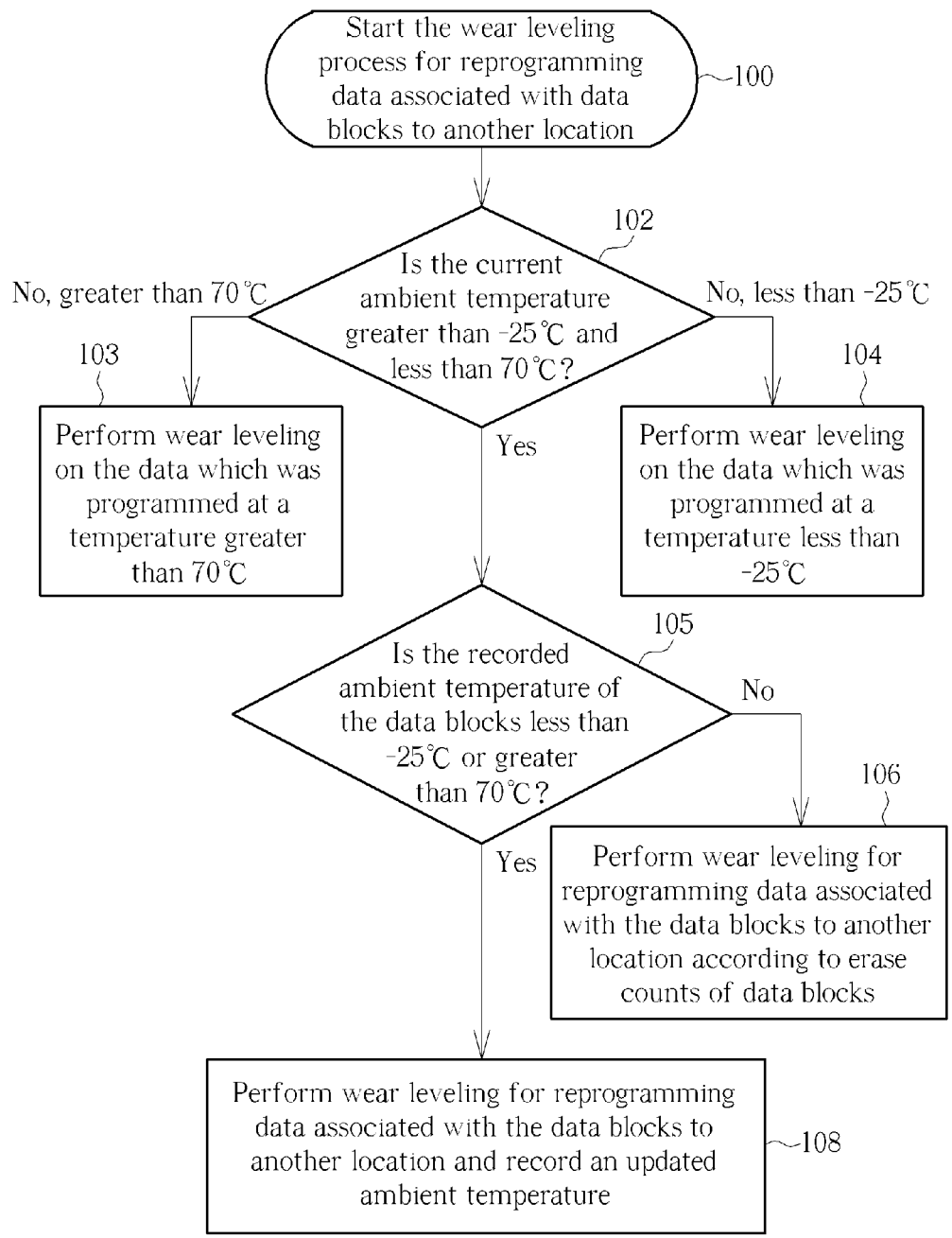
FIG. 3 is a flowchart illustrating performing wear leveling while considering ambient temperature information of the flash memory device according to the embodiment of the present invention method.

Please refer to FIG. 3. FIG. 3 is a flowchart illustrating performing wear leveling while considering ambient temperature information of the flash memory device 50 according to the embodiment of the present invention method. Steps contained in the flowchart will be explained below.

Step 100: Start the wear leveling process for reprogramming data associated with data blocks to another location in the flash memory array 60.

Step 102: Determine if the current ambient temperature of the flash memory device 50 is greater than −25° C. and less than 70° C. If so, go to step 105. If not, and the current ambient temperature is greater than 70° C., go to step 103. If not, and the current ambient temperature is less than −25° C., go to step 104.

Step 103: Perform wear leveling on the data which was programmed at a temperature greater than 70° C. Data meeting this condition can be determined according to recorded ambient temperature information. Since the current ambient temperature is also greater than 70° C., data errors due to temperature differences between when the data was programmed and when data is read for the wear leveling process will be minimized.

Step 104: Perform wear leveling on the data which was programmed at a temperature less than −25° C. Data meeting this condition can be determined according to recorded ambient temperature information. Since the current ambient temperature is also less than −25° C., data errors due to temperature differences between when the data was programmed and when data is read for the wear leveling process will be minimized.

Step 105: Determine if a recorded ambient temperature information of the data blocks is less than −25° C. or greater than 70° C. If either condition is satisfied, go to step 108. If not, go to step 106.

Step 106: Perform wear leveling for reprogramming data associated with the data blocks to another location in the flash memory array 60 according to erase counts of data blocks of the flash memory array 60.

Step 108: Perform wear leveling for reprogramming data associated with the data blocks to another location in the flash memory array 60 and record an updated ambient temperature information of the flash memory device 50.

Please note that the lower limit temperature threshold value of −25° C. and the upper limit temperature threshold value of 70° C. may be changed to other threshold values. In addition, the lower and upper limit temperature threshold values used in steps 102 and 104 do not need to be equal to each other, and can be separately chosen.

In another embodiment, steps 102, 103, and 104 could be modified such that no wear leveling process is executed at all instead of executing steps 103 and 104. In other words, when the temperature is less than −25° C. or greater than 70° C., no wear leveling step is executed in order to avoid performing wear leveling at extremely high or extremely low temperatures. Yet in another embodiment, recording an updated ambient temperature information in step 108, can be replaced by erasing the ambient temperature information in the flash memory array 60.

The described embodiment of the present invention is implemented as part of the existing wear leveling procedure, and the embodiment of the present invention records updated ambient temperature information into the flash memory array 60 when performing wear leveling on a data block being reprogrammed when the temperature criteria specified in steps 102 and 104 are satisfied. In this way, if the data block was previously recorded at an extremely low temperature or an extremely high temperature, as indicated in step 104, and if the current ambient temperature information is within a normal operating temperature range, as indicated in step 102, then the updated ambient temperature information is recorded as the data is reprogrammed during the wear leveling process. Thus, step 108 not only reprograms the data of the data block during the wear leveling process, but the updated ambient temperature information is also recorded in the flash memory array 60 during the wear leveling process. In this way, the wear leveling process removes the problems that could be caused when the data block was originally programmed at the extreme temperature since the wear leveling process reprograms the data at a normal operating temperature and also records the updated ambient temperature information in the flash memory array 60. The updated ambient temperature information data will provide the flash memory device 50 with a higher degree of confidence in the data stored in the data block than if the original recorded ambient temperature information data was an extreme temperature value.

In short, the present invention provides a simple and effective way to overcome the problems of electron displacement effects and read disturb error effects that are exacerbated when programming data at extreme temperatures and later reading the data at opposite extreme temperatures.

The present invention avoids the need to store a lookup table containing electron displacement parameters to compensate for various operating environmental factors when operating the flash memory device 50 in different conditions. Furthermore, the present invention is implemented during the wear leveling process, which is a process that would already be executed anyway. Thus, by performing wear leveling when the ambient temperature information of the flash memory device 50 is in a normal operating temperature range, the integrity of the data stored in the flash memory device 50 can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of executing wear leveling in a flash memory device according to temperature information recorded in the flash memory device, the method comprising:
   determining whether a current temperature is in a normal operating temperature range of the flash memory device; and
   reprogramming first data associated with first data blocks to another location in a flash memory array when the current temperature is in the normal operating temperature range of the flash memory device, wherein the first data is programmed in a temperature out of the normal operating temperature range of the flash memory device.

2. The method of claim 1, wherein the step of determining whether the current temperature is in the normal operating temperature range of the flash memory device comprises:
   measuring the current temperature by a temperature sensor of the flash memory device; and
   providing the measured current temperature to a controller of the flash memory device.

3. The method of claim 1, wherein ambient temperature information of the first data is recorded in the flash memory array of the flash memory device when the first data is programmed to the first data blocks.

4. The method of claim 3, wherein the ambient temperature information of the first data is recorded in a spare area of the flash memory array of the flash memory device.

5. The method of claim 3 further comprising:
updating the ambient temperature information of the first data with the current temperature after reprogramming the first data associated with the first data blocks to another location.

6. The method of claim 3 further comprising:
erasing the ambient temperature information of the first data after reprogramming the first data associated with the first data blocks to another location.

7. The method of claim 1 further comprising:
reprogramming second data associated with second data blocks to another location in the flash memory array according to erase counts of data blocks when the current temperature is greater than a maximum of the normal operating temperature range of the flash memory device, wherein the second data is programmed in a temperature which is greater than the maximum of the normal operating temperature range of the flash memory device.

8. The method of claim 7 further comprising:
reprogramming third data associated with third data blocks to another location in the flash memory array according to the erase counts of the data blocks when the current temperature is less than a minimum of the normal operating temperature range of the flash memory device, wherein the third data is programmed in a temperature which is less than the minimum of the normal operating temperature range of the flash memory device.

9. The method of claim 8, wherein the second data and the third data are parts of the first data.

10. A flash memory device, comprising:
a controller for controlling operation of the flash memory device;
a temperature sensor for providing ambient temperature information of the flash memory device to the controller; and
a flash memory array controlled by the controller to be programmed data and recorded temperature information of the data, which is a temperature when the data is programmed to a data block in the flash memory array;
wherein the data is reprogrammed by executing wear leveling in the flash memory device in a normal operating temperature range of the flash memory device if the data is programmed in the temperature which is out of the normal operating temperature range.

11. The flash memory device of claim 10, wherein the temperature information of the data is updated with a current temperature provided by the temperature sensor when the data is reprogrammed by executing wear leveling in the flash memory device.

12. The flash memory device of claim 11, wherein the normal operating temperature range of the flash memory device is greater than −25° C. and less than 70° C.

13. The flash memory device of claim 11, wherein the flash memory array further comprises:
a plurality of data blocks for storing the data; and
a plurality of spare areas for recording the temperature information of the data.

14. A method of executing wear leveling in a flash memory device according to temperature information recorded in the flash memory device, the method comprising:
programming data to data blocks in a flash memory array in a first temperature which is out of a normal operating temperature range of the flash memory device;
recording the first temperature as first temperature information in the flash memory array;
determining whether a current temperature is in the normal operating temperature range of the flash memory device; and
reprogramming the data associated with the data blocks to another location in the flash memory array when the current temperature is in the normal operating temperature range of the flash memory device.

15. The method of claim 14, wherein the step of determining whether the current temperature is in the normal operating temperature range of the flash memory device comprises:
measuring the current temperature as second temperature information provided by a temperature sensor of the flash memory device; and
providing the second temperature information to a controller of the flash memory device.

16. The method of claim 15 further comprising:
updating the first temperature information with the second temperature information when the measured second temperature is in the normal operating temperature range of the flash memory device.

17. The method of claim 14, wherein the first temperature information is recorded in a spare area of the flash memory array.

18. The method of claim 14 further comprising:
erasing the first temperature information of the data.

19. The method of claim 14, wherein when the first temperature is larger than a maximum of the normal operating temperature range of the flash memory device, the method further comprises:
reprogramming the data associated with the data blocks to another location in the flash memory array according to erase counts of the data blocks when the measured current temperature is larger than the maximum of the normal operating temperature range of the flash memory device.

20. The method of claim 19, wherein when the first temperature is less than a minimum of the normal operating temperature range of the flash memory device, the method further comprises:
reprogramming the data associated with the data blocks to another location in the flash memory array according to erase counts of the data blocks when the measured current temperature is less than the minimum of the normal operating temperature range of the flash memory device.

* * * * *